(12) United States Patent
Koyama

(10) Patent No.: US 7,476,837 B2
(45) Date of Patent: Jan. 13, 2009

(54) AMPLIFYING-TYPE SOLID-STATE IMAGING DEVICE

(75) Inventor: Eiji Koyama, Souraku-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/012,054

(22) Filed: Jan. 31, 2008

(65) Prior Publication Data

US 2008/0185502 A1 Aug. 7, 2008

(30) Foreign Application Priority Data

Feb. 1, 2007 (JP) ............................. 2007-022895

(51) Int. Cl.
*H01L 27/146* (2006.01)
*H04N 5/335* (2006.01)
(52) U.S. Cl. .................... 250/208.1; 257/292; 348/301
(58) Field of Classification Search ............. 250/208.1; 257/443, 290–292; 348/301, 308
See application file for complete search history.

(56) References Cited

U.S. PATENT DOCUMENTS 6,992,341 B2 *  1/2006  Watanabe ................... 257/292
2005/0161712 A1 *  7/2005  Koyama et al. ............. 257/292
2005/0212937 A1 *  9/2005  Koyama ..................... 348/301
2006/0232580 A1 * 10/2006  Koyama ..................... 345/211
2008/0073679 A1 *  3/2008  Koyama et al. ............. 257/292
2008/0135730 A1 *  6/2008  Kobayashi et al. ......... 250/208.1
2008/0185502 A1 *  8/2008  Koyama ............... 250/214 LS

FOREIGN PATENT DOCUMENTS

JP         2005-217607 A     8/2005

* cited by examiner

*Primary Examiner*—John R Lee
(74) *Attorney, Agent, or Firm*—Edwards Angell Palmer & Dodge LLP; David G. Conlin; David A. Tucker

(57) ABSTRACT

An amplification type solid-state image pickup device of the invention includes a plurality of photoelectric conversion sections 10 each having an embedded photodiode 1 and a transfer transistor 2, a switched capacitor amplifier section 20 whose input side is connected to a charge detection node 8 to which output terminals of the plurality of photoelectric conversion sections 10 are connected in common, and a current amplification section 21 connected between the switched capacitor amplifier section 20 and a vertical signal line 9. Signal charge from the plurality of photoelectric conversion sections 10 is converted into voltage by the switched capacitor amplifier section 20, and the converted signal is current-amplified by the current amplification section 21 and outputted to the vertical signal line 9. Thus, a less-noise, high-quality image can be obtained while a reduction of the pixel size is achieved by reducing the number of transistors per pixel.

12 Claims, 12 Drawing Sheets

AMPLIFYING-TYPE SOLID-STATE IMAGING DEVICE

CROSS-REFERENCE TO RELATED APPLICATIONS

This nonprovisional application claims priority under 35 U.S.C. §119(a) on Patent Application No(s). 2007-022895 filed in Japan on Feb. 1, 2007, the entire contents of which are hereby incorporated by reference.

BACKGROUND OF THE INVENTION

The present invention relates to amplification type solid-state image pickup devices and, more particularly, to an amplification type solid-state image pickup device which includes a plurality of pixels each having a photoelectric conversion element and a transfer transistor for transferring signal charge of the photoelectric conversion element, in which signals from the pixels are amplified and outputted, respectively, to a signal line common to the pixels.

Generally, there has been widely used an amplification type solid-state image pickup device which has a pixel section having an amplification function and a scanning circuit placed around the pixel section and in which pixel data are read from the pixel section by the scanning circuit. Particularly well known are APS (Active Pixel Sensor) type image sensors which are formed of CMOS (Complementary Metal-Oxide Semiconductor) being advantageous to integration of the pixel section with its surrounding drive circuit and signal processing circuit.

In the APS type image sensor, normally, a photoelectric conversion section, an amplification section, a pixel select section and a reset section are included in one pixel. Therefore, constituting an APS type image sensor typically involves the use of three to four MOS transistors (Tr) in addition to the photoelectric conversion section formed of photodiodes. However, providing three to four MOS transistors per pixel would be a limitation to a reduction of the pixel size. This accounts for usefulness of the technique that a plurality of photoelectric conversion sections share one amplification section to decrease the number of transistors per pixel. In this case, however, the more the number of sharing photoelectric conversion sections increases, the more the charge-voltage conversion efficiency $\eta$ ($=Vsig/Qsig$), the ratio of converted voltage signal Vsig to signal charge Qsig from photodiodes, decreases.

Accordingly, as a solution to this issue, the present inventor invented an amplification type solid-state image pickup device that involves no decrease of the charge-voltage conversion efficiency $\eta$, as shown in FIG. 10 (see JP 2005-217607 A).

This two-dimensional amplification type solid-state image pickup device, as shown in FIG. 10, is composed of: photoelectric conversion sections each having a photodiode 101 as a photoelectric conversion element and a transfer transistor 102 for transferring signal charge of the photodiode 101; an amplification section having a charge detection node 108 to which output terminals of the transfer transistors 102 are connected in common, an amplification transistor 103A to which a signal of the charge detection node 108 is inputted, a reset transistor 106 connected between the charge detection node 108 and an output terminal of the amplification transistor 103A, a capacitor 107 (its capacity denoted by Cin) connected between the charge detection node 108 and the output terminal of the amplification transistor 103A, a select transistor 104 connected between the output terminal of the amplification transistor 103A and a vertical signal line 109, and a capacitor 111 (its capacity denoted by Cup) connected between the charge detection node 108 and a boost signal line; and a constant-current load transistor 103B connected between the vertical line 109 and a power source.

As shown in FIG. 11, in a period T1, a gate drive signal $\phi S(n)$ applied to the select transistor 104 goes high level, and a gate drive signal $\phi R(n)$ applied to the reset transistor 106 goes high level, causing voltages of the charge detection node 108 and the vertical signal line 109 to be reset to a constant voltage Vo (reset level) by action of a constant-current load source-grounded inverting amplifier composed of the amplification transistor 103A and the constant-current load transistor 103B.

The reset level Vo is determined as follows. That is, the circuit of the constant-current load source-grounded inverting amplifier composed of the amplification transistor 103A and the constant-current load transistor 103B as described above is represented as shown in FIG. 12. In this case, given an input Vin and an output Vout of this inverting amplifier, when the transistors 104, 106 turn on so as to be short-circuited, it follows that Vout=Vin, and therefore the reset level Vo is determined as an intersection point with a straight line that Vout=Vin, as shown in FIG. 13.

Next, in a period T2 shown in FIG. 11, the gate drive signal $\phi R(n)$ goes low level, causing the reset transistor 106 to turn off, while the gate drive signal $\phi S(n)$ remains high level, with the select transistor 104 is in the on state. Therefore, an output (reset level Vo) resulting from inversion and amplification of the voltage of the charge detection node 108 is read via the on-state select transistor 104 to the vertical signal line 109.

In a succeeding period T3, the gate drive signal $\phi S(n)$ goes low level, causing the select transistor 104 to turn off. In this case, a gate drive signal $\phi T(n,1)$ goes high level, causing the transfer transistor 102 to turn on, so that signal charge stored in the photodiode 101 is transferred through the on-state transfer transistor 102 to the charge detection node 108. Further, in synchronization with the gate drive signal $\phi T(n,1)$, a boost signal $\phi C(n)$ goes high level, where the potential of the charge detection node 108 is deepened by capacitive coupling via the capacitor 111 (with capacitance Cup). Thus, the charge transfer from the photodiode 101 to the charge detection node 108 is accelerated.

In a next period T4, the gate drive signal $\phi T(n,1)$ goes low level, causing the transfer transistor 102 to turn off. Also, the boost signal $\phi C(n)$ goes low level, so that the potential change of the charge detection node 108 by the capacitive coupling via the capacitor 111 is canceled. As a result, a voltage (signal level) shifted by the signal charge transfer in the period T3 from the reset level (voltage Vo) in the period T2 is held at the charge detection node 108. This signal level is amplified by the constant-current load source-grounded inverting amplifier composed of the amplification transistor 103A and the constant-current load transistor 103B, and read through the on-state select transistor 104 to the vertical signal line 109.

Thereafter, a difference signal between the reset level of the period T2 read to the vertical signal line 109 and the signal level of the period T4 can be extracted as an effective signal due to charge generated by light that has been incident on the pixel.

After one horizontal scanning period (1H period), operations similar to those of the foregoing periods T1 to T4 are performed by driving the gate drive signal $\phi T(n,2)$.

In this way, iterating the operations of the periods T1 to T4 to an iteration number of k times for each one horizontal scanning period (1H period) allows signals derived from the k photodiodes 101 for each column to be respectively amplified and outputted to the vertical signal line 109.

Now, given a charge amount Qsig transferred from the photodiodes 101 and a gain A of the constant-current load source-grounded inverting amplifier, an effective signal to be read is $$V\text{sig}=A\cdot Q\text{sig}/[C_{FD}+C\text{up}+(1+A)C\text{in}] \qquad (1)$$

where the gain A of the constant-current load source-grounded inverting amplifier is $$A = gm \cdot \frac{ron \cdot rop}{ron + rop} \qquad (2)$$

In Equation (2), gm represents a transconductance of the amplification transistor 103A, ron represents an output resistance of the amplification transistor 103A, and rop represents an output resistance of the constant-current load transistor 103B.

In particular, when the gain A is very large, it is derived from Equation (1) that $$V\text{sig} \approx Q\text{sig}/C\text{in} \qquad (3)$$

Therefore, the charge-voltage conversion efficiency η results in $$\eta = V\text{sig}/Q\text{sig}=1/C\text{in} \qquad (4)$$

As can be seen from Equation (4), when the gain A is very large, there are substantially almost no effects of the capacity $C_{FD}$ of the charge detection node 108 on the outputted signal. Accordingly, even if the number of pixels connected to one another in the column direction so that the capacity $C_{FD}$ becomes large, there occurs no decrease of the charge-voltage conversion efficiency η.

However, the technique of JP 2005-217607 A is subject to occurrence of the following problem. That is, the constant-current load source-grounded inverting amplifier has to drive the vertical signal line 109 of a large load capacity in a short period. On the other hand, a relationship among an output resistance Zout of the constant-current load source-grounded inverting amplifier, the gain A and a bias current Ibias is represented by the following equation:

$$Zout \propto (Ibias)^{-1} \qquad (5)$$

$$gm \propto (Ibias)^{1/2} \qquad (6)$$

$$\therefore A \propto (Ibias)^{-1/2} \qquad (7)$$

Therefore, driving the vertical signal line 109 of a large load capacity involves increasing the bias current Ibias to lower the output resistance Zout. However, doing so would lower the gain A in turn, leading to a problem that the charge-voltage conversion efficiency η would decrease.

For example, when a load 1 pF of the vertical signal line 109 needs to be driven at 1 μS, it follows that Zout=140 kΩ, where the resulting gm=0.25 mS or so, yielding a result that gain A=35.

Now, with an arrangement that eight pixels share one switched capacitor amplifier unit 106, 107, 103A, 111, if $$C_{FD}=2 \text{ fF} \times 8=16 \text{ fF}$$

$$C\text{up}=C_{FD}$$

$$C\text{in}=1 \text{ fF},$$

then $$[C_{FD}+C\text{up}+(1+A)C\text{in}]/A=1.94 \text{ fF},$$

which is a value about twice larger than Cin, so that the charge-voltage conversion efficiency η declines.

SUMMARY OF THE INVENTION

Accordingly, an object of the present invention is to provide an amplification type solid-state image pickup device capable of obtaining a low-noise, high-quality image while reducing the number of transistors per pixel to reduce the pixel size.

In order to achieve the above object, there is provided an amplification type solid-state image pickup device including: a plurality of photoelectric conversion sections each having a photoelectric conversion element; and a transfer transistor for transferring signal charge of the photoelectric conversion element, in which signals from the plurality of photoelectric conversion sections are amplified and outputted, respectively, to a common signal line, further including:

a switched capacitor amplifier section whose input side is connected to a charge detection node to which output terminals of the plurality of photoelectric conversion sections are connected in common, the switched capacitor amplifier section serving for converting the signal charge from each of the plurality of photoelectric conversion sections into voltage; and a current amplification section for current-amplifying and outputting the signal, which has been converted into voltage by the switched capacitor amplifier section, to the common signal line.

In this amplification type solid-state image pickup device, signal charge is transferred from the respective photoelectric conversion elements of the plurality of photoelectric conversion sections via the transfer transistor to the charge detection node, the signal charge transferred from the respective photoelectric conversion sections to the charge detection node is converted into voltage by the switched capacitor amplifier section, and the voltage-converted signal is current-amplified by the current amplification section, thus being outputted to the common signal line. Like this, the switched capacitor amplifier section and the -current amplification section are common to a plurality of photoelectric conversion sections, thus making it possible to reduce the number of transistors per unit pixel. Also, since the circuit for converting the signal charge of the photoelectric conversion elements into voltage is provided by a switched capacitor type one, it becomes possible to effectively reduce the capacity of the charge detection node, so that the charge-voltage conversion efficiency can be enhanced. Moreover, the capacity reduction effect for the charge detection node by the switched capacitor amplifier section is further increased by the current amplification section, so that the charge-voltage conversion efficiency can be further enhanced. Accordingly, a less-noise, high-quality image can be obtained while a reduction of the pixel size is achieved by reducing the number of transistors per pixel.

In one embodiment of the invention, the switched capacitor amplifier section has:

an inverting amplifier whose input terminal is connected to the charge detection node;

a reset transistor connected between the charge detection node and an output terminal of the inverting amplifier; and a first capacitance element connected between the charge detection node and the output terminal of the inverting amplifier.

In this embodiment, by the use of the switched capacitor amplifier section having the inverting amplifier whose input terminal is connected to the charge detection node, the reset transistor connected between the charge detection node and the output terminal of the inverting amplifier, and the first capacitance element connected between the charge detection node and the output terminal of the inverting amplifier, it becomes possible to convert the signal charge of the photoelectric conversion elements into voltage with a simple construction.

In one embodiment of the invention, the inverting amplifier of the switched capacitor amplifier section is a constant-current load source-grounded inverting amplifier.

In this embodiment, by the use of the constant-current load source-grounded inverting amplifier as the inverting amplifier of the switched capacitor amplifier section, it becomes possible to set a large gain of the inverting amplifier with a less-component circuit construction, so that the charge-voltage conversion efficiency can be enhanced.

In one embodiment of the invention, a constant-current load of the constant-current load source-grounded inverting amplifier is a depletion-type transistor.

In this embodiment, by the use of the depletion-type transistor as the constant-current load for the constant-current load source-grounded inverting amplifier, only short-circuiting between gate and source of the transistor makes it possible to make up a constant-current load within the switched capacitor amplifier section with simplicity.

In one embodiment of the invention, the current amplification section has a current-amplifying MOS transistor to gate of which an output terminal of the switched capacitor amplifier section is connected, a common load section is connected to the current-amplifying MOS transistor via the common signal line, and the current-amplifying MOS transistor and the common signal line constitute an amplifier.

In this embodiment, a common load section is connected to the current-amplifying MOS transistor of the current amplification section via the common signal line, and the current-amplifying MOS transistor and the common load section constitute an amplifier. Thus, the load section of the current amplification section can be commonized, allowing the circuit to be simplified.

In one embodiment of the invention, the current amplification section has a select transistor connected between the current-amplifying MOS transistor and the common signal line.

In this embodiment, in the construction in which the switched capacitor amplifier section and the current amplification section are provided for each plurality of photoelectric conversion section groups, it becomes possible to select the photoelectric conversion section group by the select transistor connected between the current-amplifying MOS transistor and the common signal line, and to output to the common signal line the signals of photoelectric conversion sections of the selected group.

In one embodiment of the invention, a drain-grounded type source follower circuit is formed by a combination of the current-amplifying MOS transistor and the common load section.

In this embodiment, since the drain-grounded type source follower circuit provided by a combination of the current-amplifying MOS transistor and the common load section allows the input impedance to be higher and the output impedance to be lower, enough driving power can be obtained with a less-component circuit construction. Further, because of a small input capacity of the drain-grounded type source follower circuit, the drive current for switched capacitor amplifier section at the preceding-stage can be suppressed, allowing the switched capacitor amplifier section to obtain a large gain, which leads to an enhancement of the charge-voltage conversion efficiency.

In one embodiment of the invention, the photoelectric conversion element is an embedded-type photodiode.

In this embodiment, by realizing fully implemented charge transfer from the embedded-type photodiode, an extremely low-noise, higher-quality image can be obtained.

In one embodiment of the invention, the amplification type solid-state image pickup device further comprises:

a second capacitance element whose one end is connected to the charge detection node; and a boost section which is connected to the other end of the second capacitance element and which is for deepening a potential of the charge detection node by capacitive coupling via the second capacitance element.

In this embodiment, in charge transfer from the photoelectric conversion element via the transfer transistor to the charge detection node, the voltage of the other end of the second capacitance element is controlled by the boost section so that the potential of the charge detection node is deepened, facilitating the transfer of signal charge. As a result, the signal charge stored in the photoelectric conversion element is fully transferred without any loss, allowing extremely low noise to be achieved so that a high-quality image can be obtained.

In one embodiment of the invention, the switched capacitor amplifier section is a select-type switched capacitor amplifier section for outputting the signal, which has been converted into voltage, via the select transistor, the select-type switched capacitor amplifier section is provided in plurality, and a node to which output terminals of the plurality of select-type switched capacitor amplifier sections are connected in common is connected to an input side of the current amplification section.

In this embodiment, since the node to which output terminals of the plurality of select-type switched capacitor amplifier sections are connected in common is connected to the input side of the current amplification section, the plurality of select-type switched capacitor amplifier sections share the current amplification section, so that the number of current amplification sections needed per unit pixel decreases, making it possible to further reduce the number of transistors occupied per unit pixel. In particular, the larger number of photoelectric conversion sections sharing one current amplification section produces the larger effect, allowing the area occupied by the photoelectric conversion elements to be increased, which in turn allows higher sensitivity to be realized.

In one embodiment of the invention, the amplification type solid-state image pickup device further comprises:

a control section for controlling voltage of a power supply line of the inverting amplifier of the switched capacitor amplifier section.

In this embodiment, controlling the voltage of the power supply line of the inverting amplifier by the control section makes it possible to halt the operation when a relevant photoelectric conversion section is a non-selected line. This eliminates the need for the select transistor, which would be involved in the prior art, so that the number of transistors per pixel can be reduced.

In one embodiment of the invention, operation of the current amplification section is halted by setting an output of the inverting amplifier to low level, which is effected by the control section's setting a voltage of the power supply line of the inverting amplifier of the switched capacitor amplifier section to low level out of high and low levels.

In this embodiment, by an operation that the voltage of the power supply line of the inverting amplifier of the switched capacitor amplifier section is changed from high level to low level by the control section, the operation of the current amplification section can easily be halted.

As apparent from the above description, according to the amplification type solid-state image pickup device of the invention, there can be realized an amplification type solid-state image pickup device capable of obtaining a low-noise, high-quality image while reducing the number of transistors per pixel to reduce the pixel size.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein.

DETAILED DESCRIPTION OF THE INVENTION

Hereinbelow, the amplification type solid-state image pickup device of the present invention will be described in detail with reference to the accompanying drawings.

First Embodiment

Figure 1:
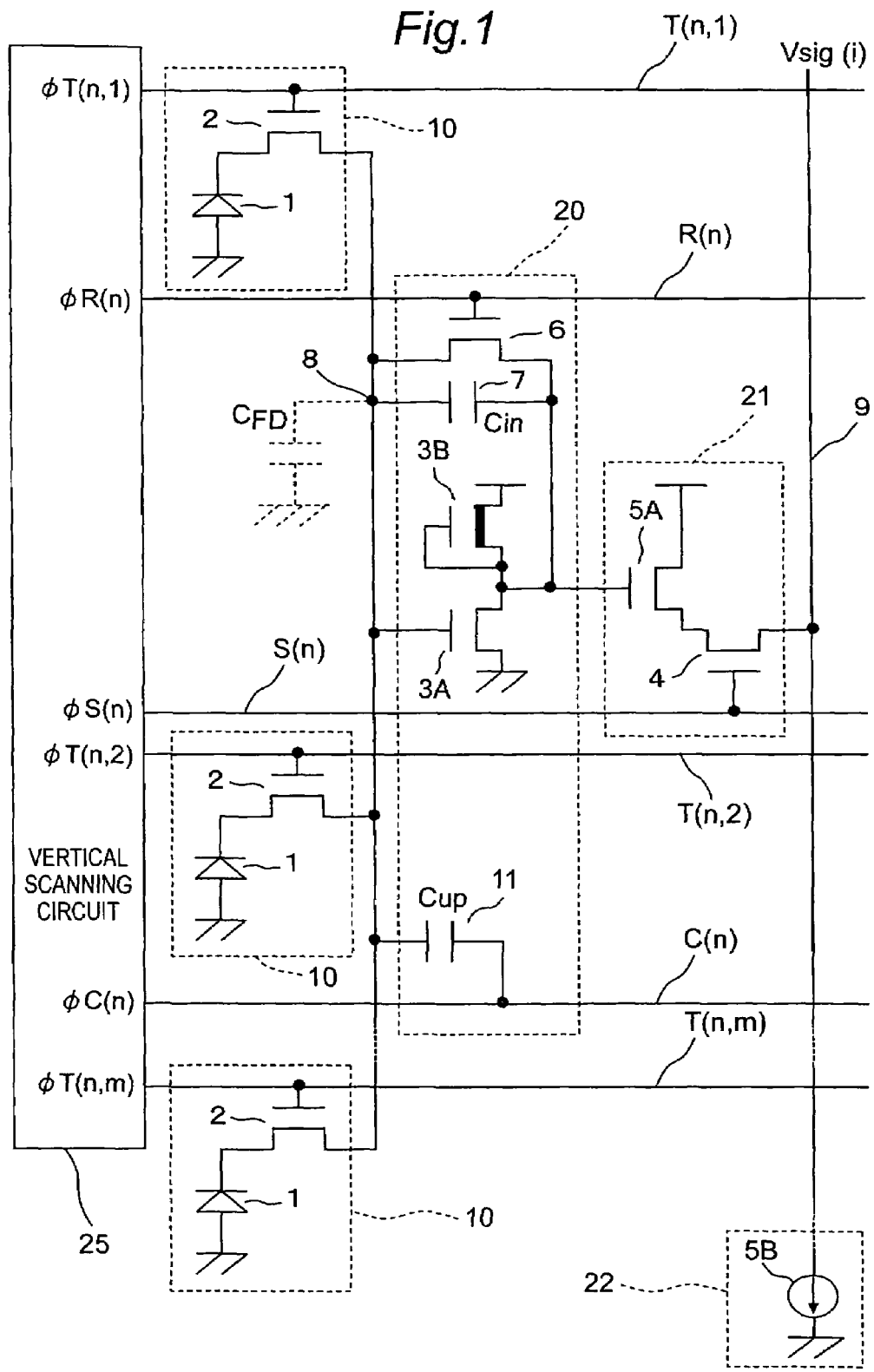
FIG. 1 is a view showing a construction of a two-dimensional amplification type solid-state image pickup device according to a first embodiment of the invention.

FIG. 1 is a circuit diagram showing part of a two-dimensional amplification type solid-state image pickup device according to a first embodiment of the invention. Pixels of the device are two-dimensionally arrayed in a matrix, and here is shown an n-th row within an i-th column for simplicity's sake, where m pixels are included in each one row (where $m \geq 2$, $n \geq 2$ and $i \geq 2$).

FIG. 1 shows a photoelectric conversion section group composed of m photoelectric conversion sections 10 of the i-th column out of a plurality of rows and columns of photoelectric conversion sections 10, one switched capacitor amplifier section 20 connected to the photoelectric conversion section group, and one current amplification section 21 connected to the one switched capacitor amplifier section 20.

This two-dimensional amplification type solid-state image pickup device, as shown in FIG. 1, is composed of the photoelectric conversion sections 10, the switched capacitor amplifier section 20, the current amplification section 21, a vertical signal line load section 22 as an example of a common load section, and a vertical scanning circuit 25 including a boost section and a control section. Each of the photoelectric conversion sections 10 includes an embedded-type photodiode 1 as an example of a photoelectric conversion element, and a transfer transistor 2 for transferring signal charge of the photodiode 1.

Also, the switched capacitor amplifier section 20 has a charge detection node 8 (its capacity-denoted by $C_{FD}$) to which output terminals of the transfer transistors 2 of the photoelectric conversion sections 10 are connected in common, a constant-current load source-grounded inverting amplifier composed of an amplification transistor 3A with the charge detection node 8 connected to its gate and a depletion-type constant-current load transistor 3B, a reset transistor 6 connected between the charge detection node 8 and an output of the inverting amplifier (3A, 3B), a capacitor 7 (its capacity denoted by Cin) as an example of a first capacitance element connected between the charge detection node 8 and the inverting amplifier (3A, 3B), and a capacitor 11 (its capacity denoted by Cup) as an example of a second capacitance element connected between the charge detection node 8 and a later-described boost signal line.

Also, the current amplification section 21 has a current amplification transistor 5A being a current-amplifying MOS transistor which is inserted between an output of the switched capacitor amplifier section 20 and a vertical signal line 9 as an example of a common signal line, and to the gate of which an output terminal of the switched capacitor amplifier section 20 is connected, and a select transistor 4 connected between an output of the current amplification transistor 5A and the vertical signal line 9.

Further, the vertical signal line load section 22 is implemented by a constant-current load transistor 5B connected between the vertical signal line 9 and the ground potential. A combination of the current amplification transistor 5A included in the current amplification section 21 and the constant-current load transistor 5B makes up a drain-grounded type source follower circuit.

Referring to FIG. 1, reference characters T(n,1), T(n,2), ..., T(n,m) denote gate drive signal lines for controlling the transfer transistors 2, respectively, R(n) denotes a gate drive signal line for controlling the reset transistor 6, and S(n) denotes a gate drive signal line for controlling the select transistor 4.

Also, C(n) denotes a boost signal line, and the capacitor 11 as a second capacitance element is connected to the boost signal line C(n). In an operation mode, the boost signal φC(n) is raised to a high voltage at a specified timing by the control section of the vertical scanning circuit 25, and the potential of the charge detection node 8 can be deepened by capacitive coupling via the capacitor 11.

Via the gate drive signal lines T(n,1), T(n,2), ..., T(n,m), gate drive signals φT(n,1), φT(n,2), ..., φT(n,m) from the vertical scanning circuit 25 are applied to the gates of the transfer transistors 2, respectively. Also, via the gate drive signal line R(n), a gate drive signal φR(n) from the vertical scanning circuit 25 is applied to the gate of the reset transistor 6 of the switched capacitor amplifier section 20. Also, via the gate drive signal line S(n), a gate drive signal φS(n) from the vertical scanning circuit 25 is applied to the gate of the select transistor 4 of the current amplification section 21. Further, via the boost signal line C(n), a boost signal φC(n) from the vertical scanning circuit 25 is applied to the other end of the capacitor 11 of the switched capacitor amplifier section 20.

Figure 2:
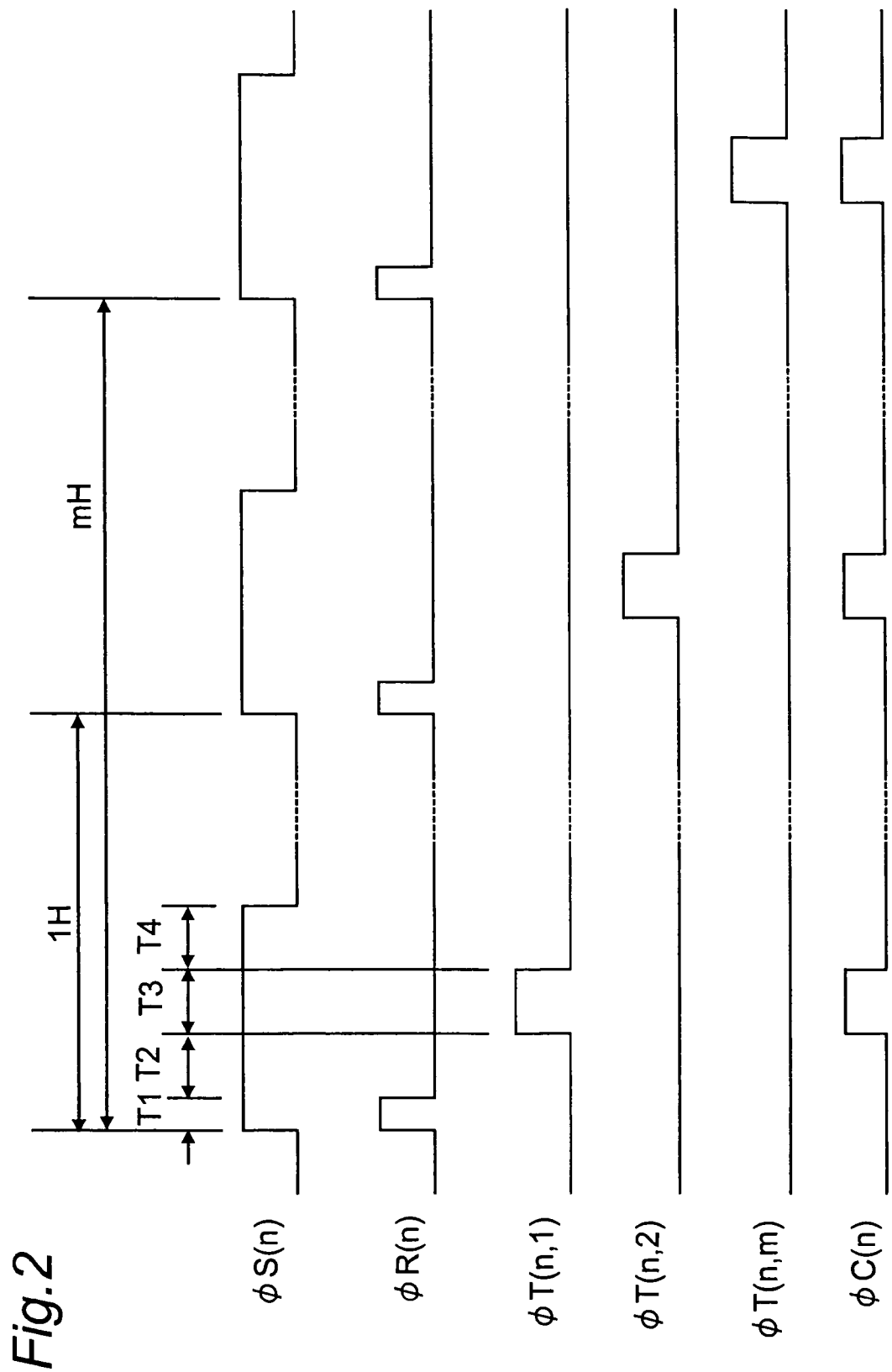
FIG. 2 is a chart showing operation timings of the two-dimensional amplification type solid-state image pickup device.

FIG. 2 shows operation timings of the two-dimensional amplification type solid-state image pickup device.

In a period T1 shown in FIG. 2, a gate drive signal φS(n) applied to the select transistor 4 first goes high level, and a gate drive signal φR(n) applied to the reset transistor 6 goes high level. As a result, the reset transistor 6 turns on, and voltage of the charge detection node 8 and output voltage of the constant-current load source-grounded inverting amplifier are reset to a constant voltage Vo (reset level) by action of the constant-current load source-grounded inverting amplifier composed of the amplification transistor 3A and the constant-current load transistor 3B.

Figure 3:
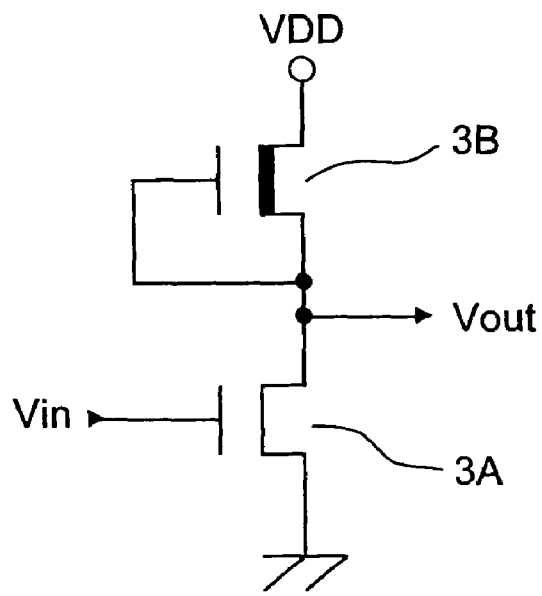
FIG. 3 is a view showing a circuit construction of a constant-current load source-grounded inverting amplifier made up of elements of the two-dimensional amplification type solid-state image pickup device.
Figure 4:
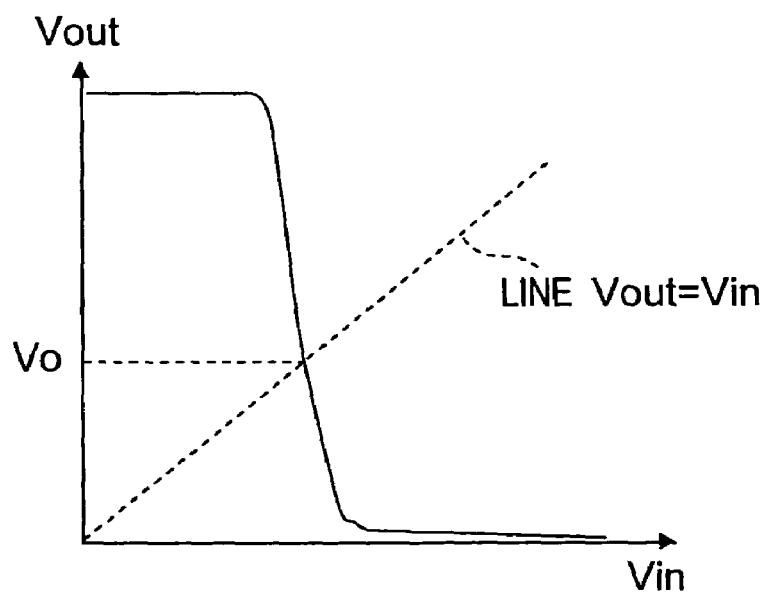
FIG. 4 is a chart showing characteristics of the inverting amplifier shown in FIG. 3.

The reset level Vo is determined as follows. That is, the circuit of the constant-current load source-grounded inverting amplifier composed of the amplification transistor 3A and the constant-current load transistor 3B is represented as shown in FIG. 3. Then, given an input Vin and an output Vout of this inverting amplifier, when the transistor 6 turns on so that its input and output are short-circuited as described above, it follows that Vout=Vin, and therefore the reset level Vo is determined as an intersection point with a straight line that Vout=Vin, as shown in FIG. 4.

In response to the input of the reset level Vo, an output Vsig(i) of the drain-grounded type source follower circuit (5A, 5B) composed of the current amplification transistor 5A and the constant-current load transistor 5B is output to the vertical signal line 9.

In a succeeding period T2, the gate drive signal φR(n) goes low level, causing the reset transistor 6 to turn off. Meanwhile, the gate drive signal φS(n) remains high level, with the select transistor 4 is in the on state. Therefore, an output resulting from inversion and amplification of the voltage of the charge detection node 108, i.e. the output Vsig(i) of the source follower circuit (5A, 5B) whose input is the reset level Vo, is read via the on-state select transistor 4 to the vertical signal line 9.

In a succeeding period T3, the gate drive signal φT(n,1) goes high level, causing the transfer transistors 2 to turn on. Signal charge stored in the photodiode 1 is transferred through the on-state transfer transistor 2 to the charge detection node 8. Further, in synchronization with the gate drive signal φT(n,1), a boost signal φC(n) goes high level. As a result, the potential of the charge detection node 8 is deepened by capacitive coupling via the capacitor 11 (with capacitance Cup). Thus, the charge transfer from the photodiode 1 to the charge detection node 8 is accelerated. It is noted that potential changes of the charge detection node 8 correspond to divided one of a voltage increase of the boost signal line C(n) into the capacitance Cup of the capacitor 11 and the capacity $C_{FD}$ of the charge detection node 8.

In a next period T4, the gate drive signal φT(n,1) goes low level, causing the transfer transistor 2 to turn off. Also, the gate drive signal φC(n) goes low level, so that the potential change of the charge detection node 8 by the capacitive coupling via the capacitor 11 is canceled. As a result, a voltage (signal level) shifted by the signal charge transfer in the period T3 from the reset level (voltage Vo) in the period T2 is held at the charge detection node 8. This signal level is amplified by the constant-current load source-grounded inverting amplifier composed of the amplification transistor 3A and the constant-current load transistor 3B, and then inputted to the drain-grounded type source follower circuit (5A, 5B) and its output Vsig(i) is read via the on-state select transistor 4 to the vertical signal line 9.

Then, a difference signal between the reset level of the period T2 and the signal level of the period T4 read to the vertical signal line 9 can be extracted by a known CDS (Correlated Double Sampling) circuit or differential circuit or the like to obtain an effective signal by the charge generated by light that has been incident on the photodiodes 1 of the first photoelectric conversion section 10.

After one horizontal scanning period (1H period), operations similar to those of the foregoing periods Ti to T4 are performed for the second photoelectric conversion section 10 by driving the gate drive signal φT(n,2) instead of φT(n,1).

In this way, iterating the operations of the periods T1 to T4 for every photoelectric conversion section 10 allows signals derived from the photodiodes 1 for each column to be respectively amplified and outputted to the vertical signal line 9. The signals Vsig(i) read to the vertical signal line 9 are outputted one by one through an unshown horizontal signal line provided in common to the vertical signal lines.

Now, given a charge amount Qsig transferred from the photodiodes 1, a gain A of the constant-current load source-grounded inverting amplifier and a gain B of the source follower circuit, an effective signal to be read is $$Vsig = B \cdot A \cdot Qsig / [C_{FD} + Cup + (1+A)Cin] \tag{8}$$

where the gain B of the source follower circuit is about 0.9 and the gain A of the constant-current load source-grounded inverting amplifier is $$A = gm \cdot \frac{ron \cdot rop}{ron + rop} \tag{9}$$

In Equation (9), gm represents a transconductance of the amplification transistor 3A, ron represents an output resistance of the amplification transistor 3A, and rop represents an output resistance of the constant-current load transistor 3B. In particular, when the gain A is very large, it is derived from Equation (8) that $$V\text{sig} \approx B \cdot Q\text{sig}/C\text{in} \quad (10)$$

Therefore, the charge-voltage conversion efficiency η results in $$\eta = V\text{sig}/Q\text{sig} = B/C\text{in} \quad (11)$$

As can be seen from Equation (11), when the gain A is very large, there are substantially almost no effects of the capacity $C_{FD}$ of the charge detection node 8 on the outputted signal.

However, in the case of a conventional amplification type solid-state image pickup device, since the switched capacitor amplifier section 20 directly drives the vertical signal line 9, there is a need for lowering the output resistance Zout, so that the gain A of the inverting amplifier would be hard to increase, resulting in a lowered charge-voltage conversion efficiency η, as a problem. In contrast to this, in this invention, since the current amplification section 21 is provided between the switched capacitor amplifier section 20 and the vertical signal line 9, there is no need for lowering the output resistance Zout of the switched capacitor amplifier section 20, so that the gain A of the inverting amplifier can be maintained high.

For instance, the input load of the current amplification section 21 is not more than one hundredth of that of the vertical signal line 9, and therefore if the output resistance Zout is set 100 times larger than the conventional counterpart, then it follows that $$Z\text{out} = 14 \text{ M}\Omega,$$

resulting in a gain A=350.

Now, given an arrangement that eight pixels share one switched capacitor amplifier section 20, it follows similarly that $$C_{FD} = 2 \text{ fF} \times 8 = 16 \text{ fF},$$

$$C\text{up} = C_{FD}, \text{ and}$$

$$C\text{in} = 1 \text{ fF},$$

then, $$[C_{FD} + C\text{up} + (1+A)C\text{in}]/A = 1.09 \text{ fF},$$

which is a value almost equal to Cin, proving that the charge-voltage conversion efficiency η can be prevented from decreasing.

Therefore, even if the number m of the photoelectric conversion section 10 connected in common in the column direction is increased, causing the capacity $C_{FD}$ of the charge detection node 8 to be increased, there occurs no decrease of the charge-voltage conversion efficiency η. This benefit is more than compensating for some increments (constant-current load transistor 3B and current amplification transistor 5A) of the number of transistors in this invention, as compared with prior-art amplification type solid-state image pickup devices.

That is, in the case of a prior-art amplification type solid-state image pickup device, on the, assumption that eight pixels share one switched capacitor amplifier section 20, a number of transistors occupied by one pixel is 11/8=1.375 transistors/pixel, and when $$C_{FD} = 2 \text{ fF} \times 8 = 16 \text{ fF},$$

$$C\text{up} = C_{FD}, \text{ and}$$

$$C\text{in} = 1 \text{ fF},$$

and gain A=35, then charge-voltage conversion efficiency is
charge-voltage conversion efficiency
=1/1.94 (fF)
=5.15×10$^{14}$ (V/coulomb)
=8.24×10$^{-5}$ (V/electron)
=82.4 (μV/electron).

While, the amplification type solid-state image pickup device of the invention, with an arrangement that eight pixels share one switched capacitor amplifier section 20 likewise, and when gain A=350 and gain B of source follower circuit=0.9, then
a number of transistors occupied by one pixel
=13/8=1.625 transistors/pixel
charge-voltage conversion efficiency
=1/1.09 (fF)×B
=9.17×10$^{14}$ (V/coulomb)×0.9
=13.2×10$^{-5}$ (V/electron)
=132 (μV/electron), showing that the charge-voltage conversion efficiency improves by 60% against an 18% increase of transistors per pixel. Thus, it is apparent that the invention is useful for sensitivity enhancement.

According to the two-dimensional -amplification type solid-state image pickup device made up as shown above, signal charge is transferred to the charge detection node 8 from the respective photodiodes 1 of a plurality of photoelectric conversion sections 10 via the transfer transistors 2, the signal charge transferred from the respective photoelectric conversion sections 10 to the charge detection node 8 is converted into voltage by the switched capacitor amplifier section 20, and the voltage-converted signal is current-amplified by the current amplification section 21, thus being outputted to the vertical signal line 9. Like this, the switched capacitor amplifier section 20 and the current amplification section 21 are common to a plurality of photoelectric conversion sections 10, thus making it possible to reduce the number of transistors per unit pixel. Also, since the circuit for converting the signal charge of the photodiodes 1 into voltage is provided by a switched capacitor type one, it becomes possible to effectively reduce the capacity of the charge detection node 8, so that the charge-voltage conversion efficiency can be enhanced. Moreover, the capacity reduction effect for the charge detection node 8 by the switched capacitor amplifier section 20 is further increased by the current amplification section 21, so that the charge-voltage conversion efficiency can be further enhanced. Accordingly, a less-noise, high-quality image can be obtained while a reduction of the pixel size is achieved by reducing the number of transistors per pixel.

Also, by the use of the switched capacitor amplifier section 20 having the inverting amplifier (3A, 3B) whose input terminal is connected to the charge detection node 8, the reset transistor connected between the charge detection node 8 and the output terminal of the inverting amplifier (3A, 3B), and the capacitor 7 connected between the charge detection node 8 and the output terminal of the inverting amplifier (3A, 3B), it becomes possible to convert the signal charge of the photodiodes 1 into voltage with a simple construction.

Also, by the use of the constant-current load source-grounded inverting amplifier as the inverting amplifier (3A, 3B) of the switched capacitor amplifier section 20, it becomes possible to set a large gain of the inverting amplifier with a less-component circuit construction, so that the charge-voltage conversion efficiency can be enhanced.

Also, by the use of the depletion-type constant-current load transistor 3B as the constant-current load for the constant-current load source-grounded inverting amplifier (3A, 3B), only short-circuiting between its gate and source makes it possible to make up a constant-current load within the switched capacitor amplifier section 20 with simplicity.

In addition, gate-source short-circuiting in an enhancement type transistor would result in no flow of current, and drain-source short-circuiting in an enhancement type transistor would result in some other than a constant-current load even with a flow of current, so that a large amplifier gain could not be obtained. Accordingly, making up a constant-current load that allows a large amplifier gain to be obtained with a simple construction involves providing a depletion-type transistor.

The current amplification section 21 has the current amplification transistor 5A provided by using a current-amplification MOS transistor whose gate is connected to the output terminal of the switched capacitor amplifier section 20, and the vertical signal line load section 22 is connected to the current amplification transistor 5A via the vertical signal line 9, so that the current amplification transistor 5A and the vertical signal line load section 22 constitute an amplifier. Thus, the load section of the current amplification section 21 can be commonized, allowing the circuit to be simplified.

Also, in the current amplification section 21, connecting the select transistor 4 between the current amplification transistor 5A and the vertical signal line 9 makes it possible that with the switched capacitor amplifier section 20 and the current amplification section 21 provided for each group of a plurality of photoelectric conversion sections, a group of photoelectric conversion sections is selected by the select transistor 4 connected between the current amplification transistor 5A and the vertical signal line 9, and signals of photoelectric conversion sections 10 of the selected group are outputted to the vertical signal line 9.

Also, since the drain-grounded type source follower circuit provided by a combination of the current amplification transistor 5A and the vertical signal line load section 22 allows the output impedance to be lowered, enough driving power can be obtained with a less-component circuit construction. Further, because of a small input capacity of the drain-grounded type source follower circuit, the drive current for the preceding-stage switched capacitor amplifier section 20 can be suppressed, allowing the switched capacitor amplifier section 20 to obtain a large gain, which leads to an enhancement of the charge-voltage conversion efficiency.

Also, since the photodiode 1 is an embedded-type photodiode, signal charge stored in the photodiode 1 is transferred without any loss, allowing a noise reduction to be achieved so that a high-quality image can be obtained.

Also, in charge transfer from the photodiode 1 via the transfer transistor 2 to the charge detection node 8, the voltage of the other end of the capacitor 11 is controlled by the boost section of the vertical scanning circuit 25 so that the potential of the charge detection node 8 is deepened, facilitating the transfer of signal charge. As a result, the signal charge stored in the photodiode 1 is fully transferred without any loss, allowing extremely low noise to be achieved so that a high-quality image can be obtained.

Second Embodiment

Figure 5A:
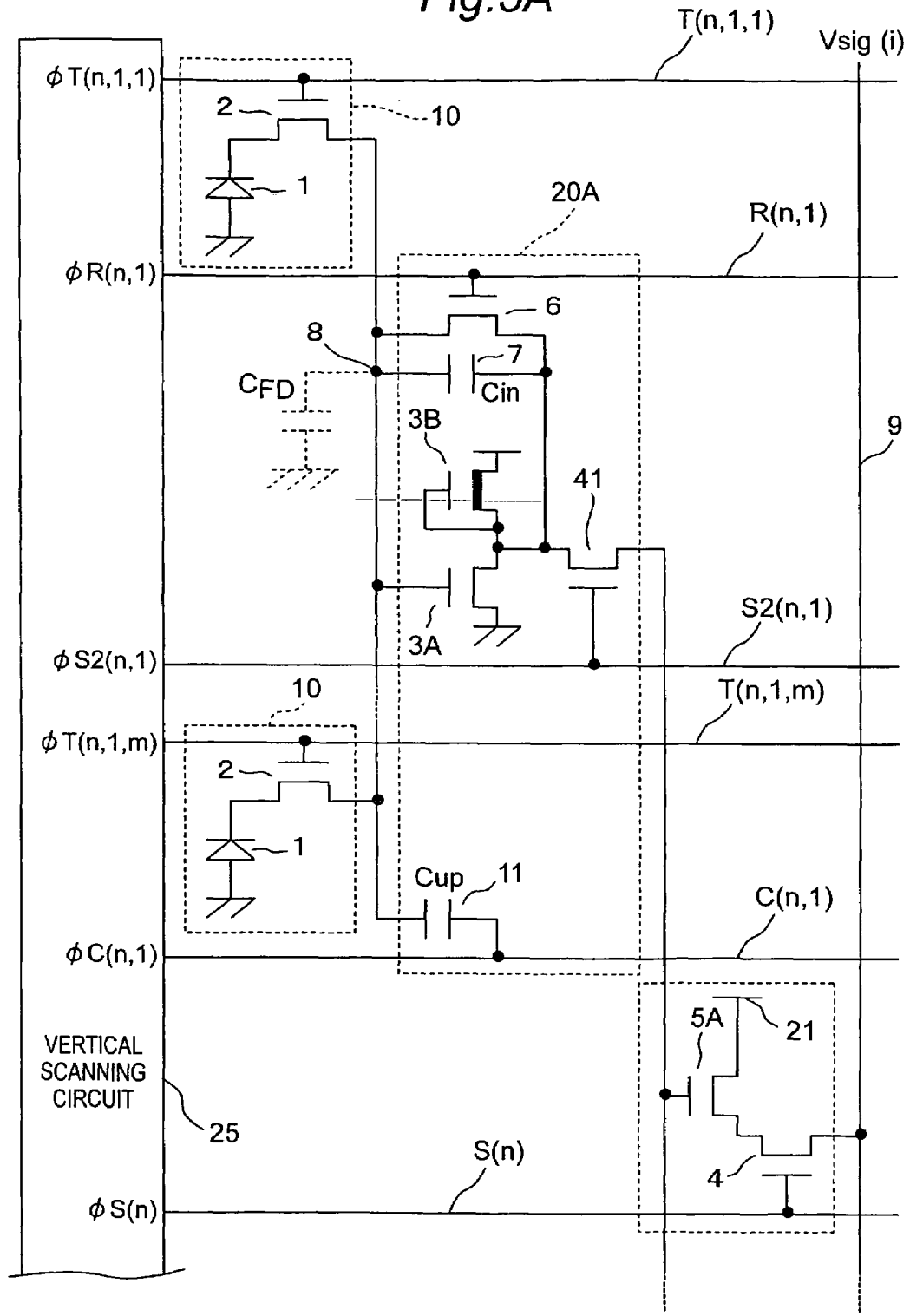
FIG. 5A is a view showing a construction of a two-dimensional amplification type solid-state image pickup device according to a second embodiment of the invention.
Figure 5B:
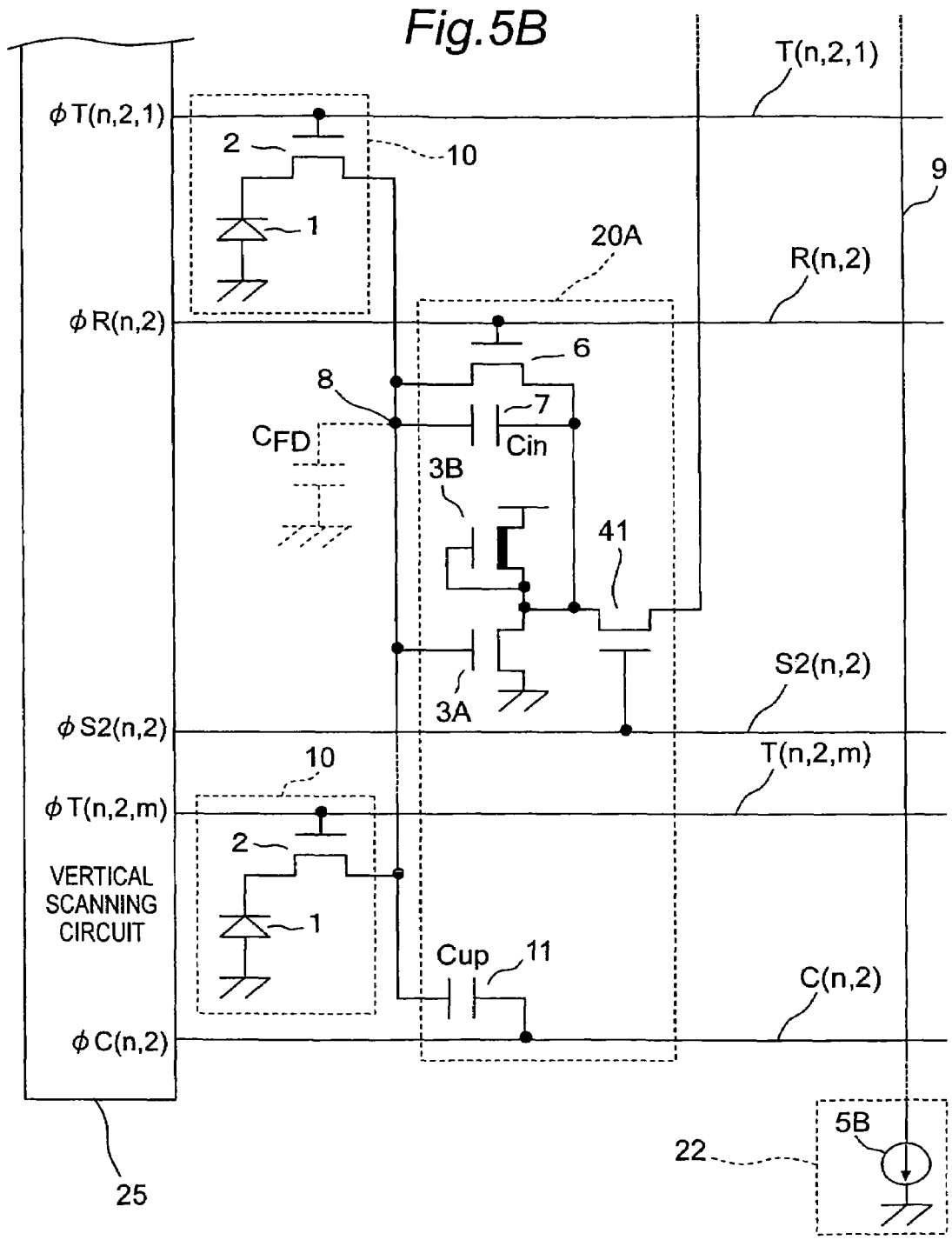
FIG. 5B is a view showing the construction of the two-dimensional amplification type solid-state image pickup device in continuation to FIG. 5A.

FIGS. 5A and 5B are circuit diagrams showing part of a two-dimensional amplification type solid-state image pickup device according to a second embodiment of the invention.

In the first embodiment, the switched capacitor amplifier section 20 and the current amplification section 21 included in the two-dimensional amplification type solid-state image pickup device are equal in number. However, in this second embodiment, a plurality of select-type switched capacitor amplifier sections 20A share one current amplification section 21. Like component members other than the above in conjunction with the first embodiment are designated by like reference numerals, and their individual description is omitted.

FIGS. 5A and 5B show two photoelectric conversion section groups each composed of m photoelectric conversion sections 10 of the i-th column out of a plurality of rows and a plurality of columns of photoelectric conversion sections 10, two select-type switched capacitor amplifier sections 20A connected respectively to two photoelectric conversion section groups, and one current amplification section 21 connected to the two select-type switched capacitor amplifier sections 20A.

Reference numerals T(n,1,1), . . . , T(n,1,m), T(n,2,1), . . . , T(n,2,m) denote gate drive signal lines for controlling the transfer transistors 2, respectively, R(n,1), R(n,2) denote gate drive signal lines for controlling the reset transistors 6, and S(n) denotes a gate drive signal line for controlling the select transistor 4. Also, S2(n,1), S2(n,2) denote gate drive signal lines for controlling select transistors 41 of the select-type switched capacitor amplifier sections 20A, respectively, and C(n,1), C(n,2) denote boost signal lines, respectively.

Via the gate drive signal lines T(n,1,1), . . . , T(n,1,m), T(n,2,1), . . . , T(n,2,m), gate drive signals φT(n,1,1), . . . , φT(n,1,m), φT(n,2,1), . . . , φT(n,2,m) from the vertical scanning circuit 25 are applied to gates of the transfer transistors 2, respectively. Also, via the gate drive signal lines R(n,1), R(n,2), gate drive signals φR(n,1), φR(n,2) from the vertical scanning circuit 25 are applied to the gates of the reset transistors 6 of the select-type switched capacitor amplifier sections 20A. Also, via the gate drive signal line S(n), a gate drive signal φS(n) from the vertical scanning circuit 25 is applied to the select transistor 4 of the current amplification section 21. Also, via the gate drive signal lines S2(n,1), S2(n,2), gate drive signals φS2(n,1), φS2(n,2) from the vertical scanning circuit 25 are applied to gates of the select transistors 41 of the select-type switched capacitor amplifier sections 20A, respectively. Further, via the boost signal lines C(n,1), C(n,2), boost signals φC(n,1), φC(n,2) from the vertical scanning circuit 25 are applied to the other ends of the capacitors 11 of the select-type switched capacitor amplifier sections 20A, respectively.

In this two-dimensional amplification type solid-state image pickup device of this second embodiment, the select transistors 41 are newly added to the select-type switched capacitor amplifier sections 20A. However, since the current amplification section 21 is shared among a plurality of select-type switched capacitor amplifier sections 20A, the number of transistors per pixel can be further reduced as compared with the two-dimensional amplification type solid-state image pickup device of the first embodiment. The larger the number m of shared photoelectric conversion sections 10 is, the larger the produced effect is, allowing the area occupied by photodiodes 1 to increase accordingly, which in turn allows higher sensitivity to be realized.

Figure 6:
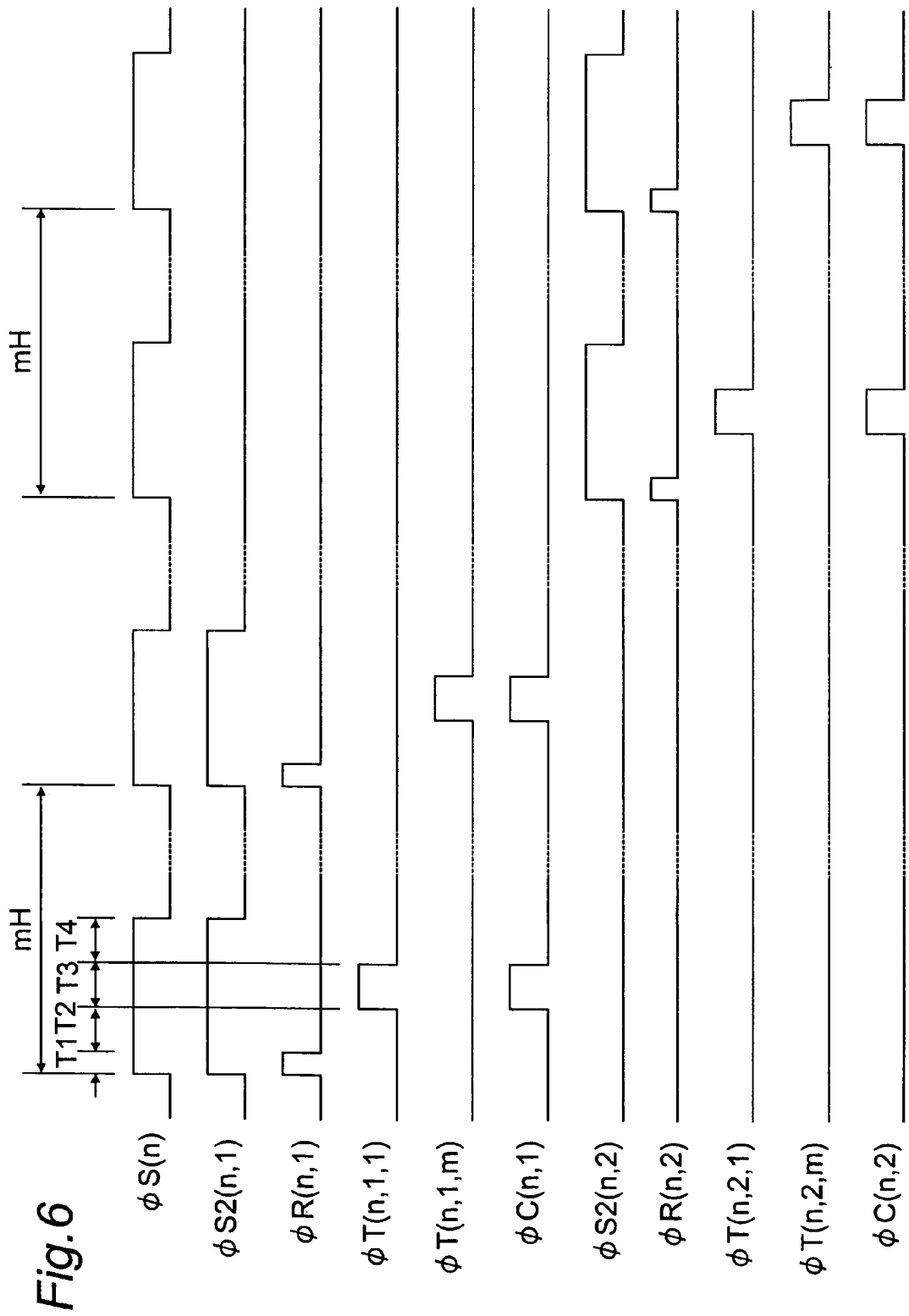
FIG. 6 is a chart showing operation timings of the two-dimensional amplification type solid-state image pickup device of FIGS. 5A and 5B.

FIG. 6 shows drive timings, where the drive principle is similar to that of the two-dimensional amplification type solid-state image pickup device of the first embodiment.

Since the node to which output terminals of a plurality of select-type switched capacitor amplifier sections 20A are connected in common is connected to the input side of the current amplification section 21, the plurality of select-type switched capacitor amplifier sections 20A share the current amplification section 21, so that the number of current amplification sections needed per unit pixel decreases, making it possible to further reduce the number of transistors occupied per unit pixel. In particular, the larger number of photoelectric conversion sections 10 sharing one current amplification section produces the larger effect, allowing the area occupied by the photodiodes 1 to be increased, which in turn allows higher sensitivity to be realized.

Third Embodiment

Figure 7:
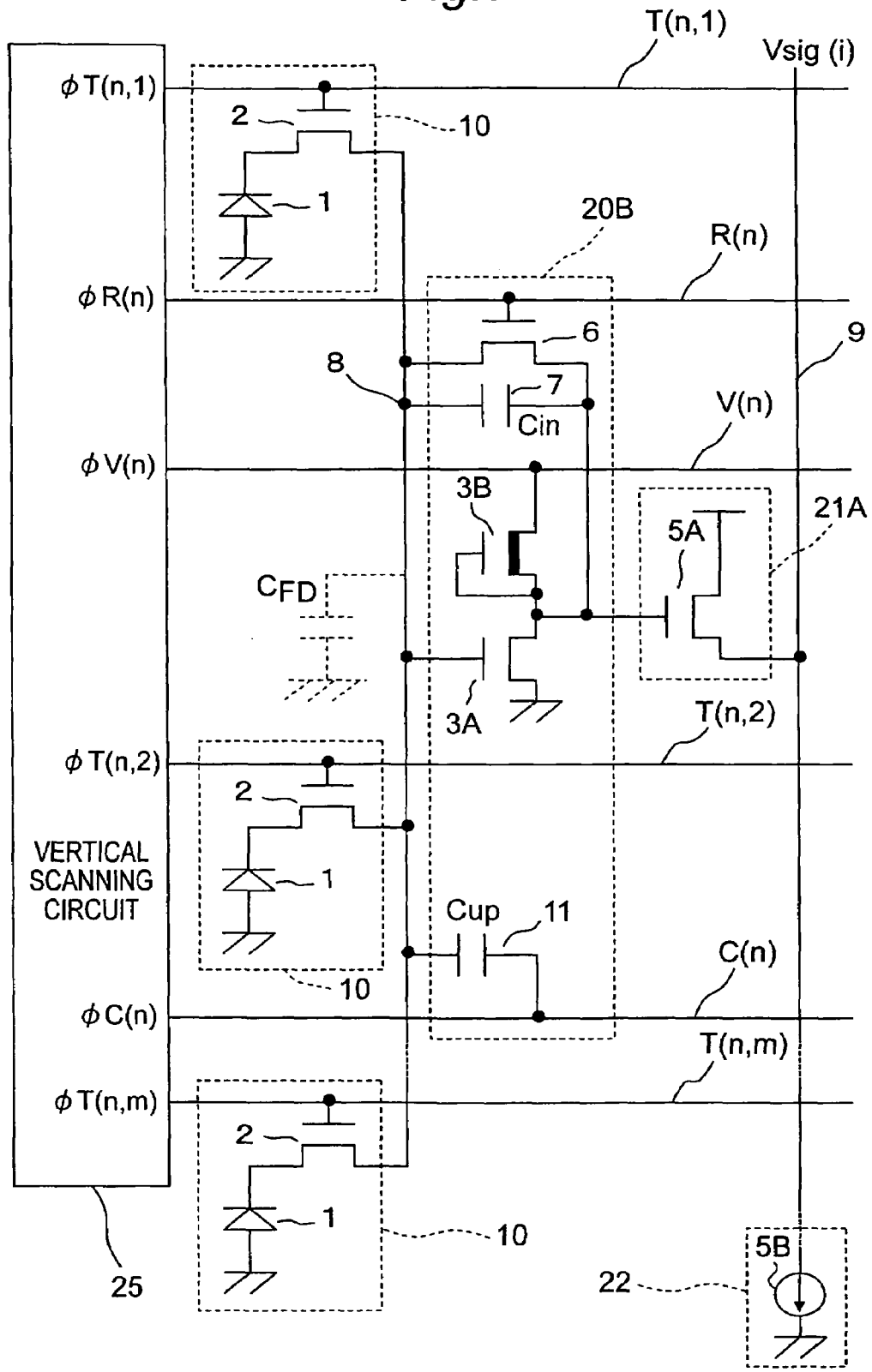
FIG. 7 is a view showing a construction of a two-dimensional amplification type solid-state image pickup device according to a third embodiment of the invention.

FIG. 7 is a circuit diagram showing part of a two-dimensional amplification type solid-state image pickup device according to a third embodiment of the invention.

This two-dimensional amplification type solid-state image pickup device of the third embodiment differs from that of the first embodiment in that a current amplification section 21A includes no select transistors, and that a switched capacitor amplifier section 20B is controlled by a control line V(n) without fixing the power supply line of the inverting amplifier (3A, 3B) to the power supply voltage. The rest of component members are similar to those of the first embodiment, and like component members are designated by like reference numerals and so their individual description is omitted.

Figure 8:
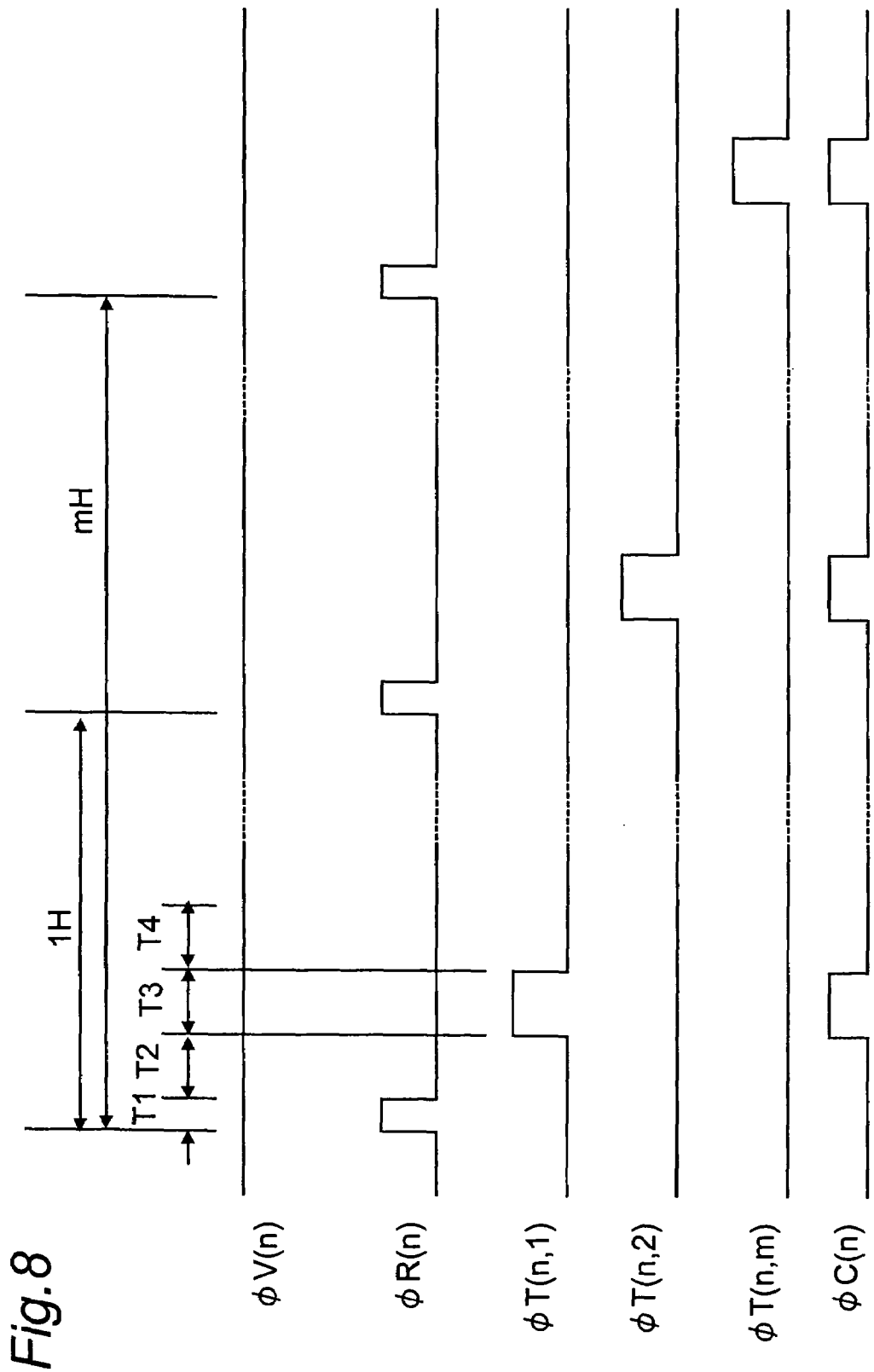
FIG. 8 is a chart showing operation timings of a selected row of the two-dimensional amplification type solid-state image pickup device.

FIG. 8 shows drive timings in a case where the n-th line is the selected line. The description for this case is similar to that of the first embodiment and omitted.

Figure 9:
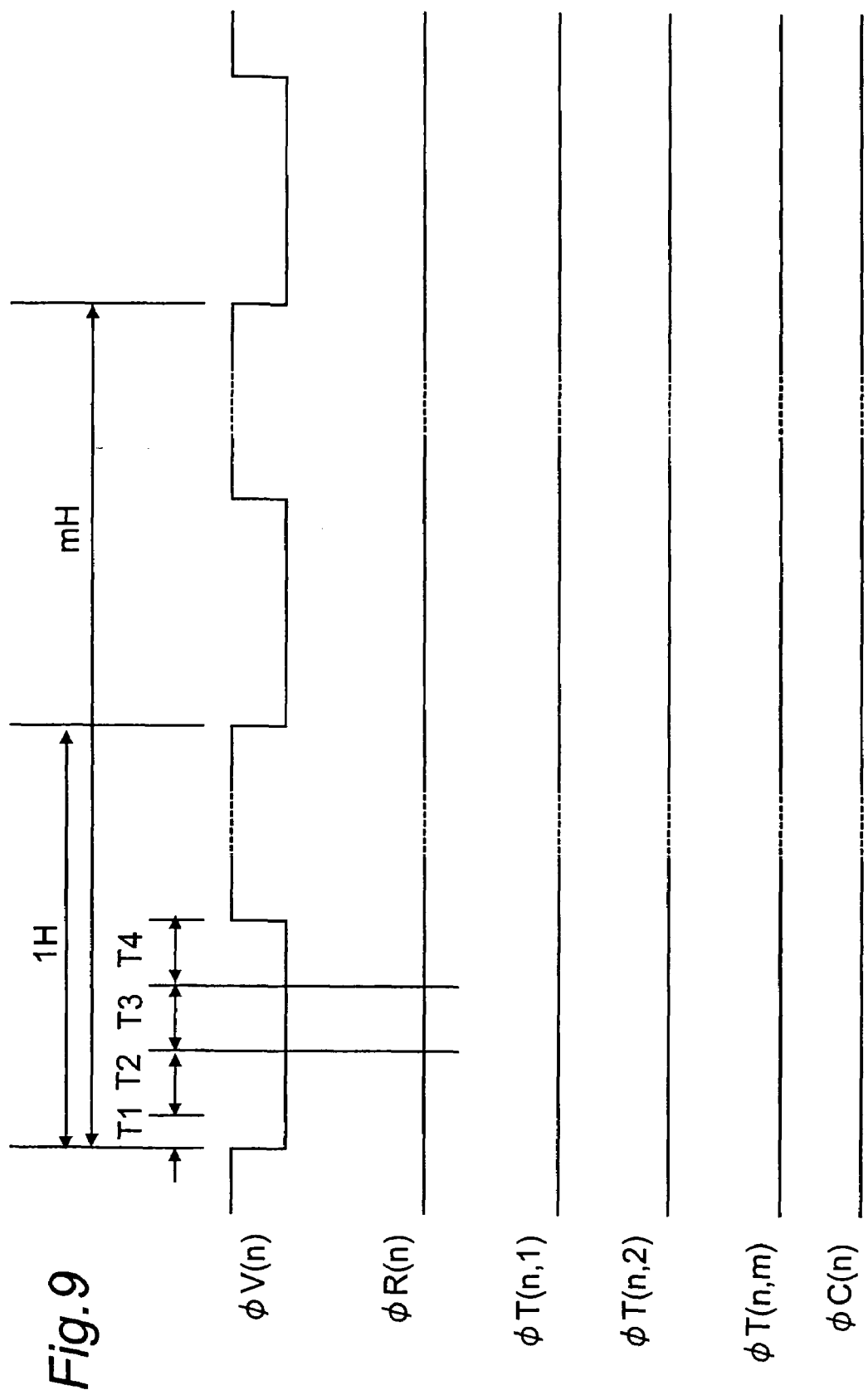
FIG. 9 is a chart showing operation timings of a non-selected row of the two-dimensional amplification type solid-state image pickup device.
Figure 10:
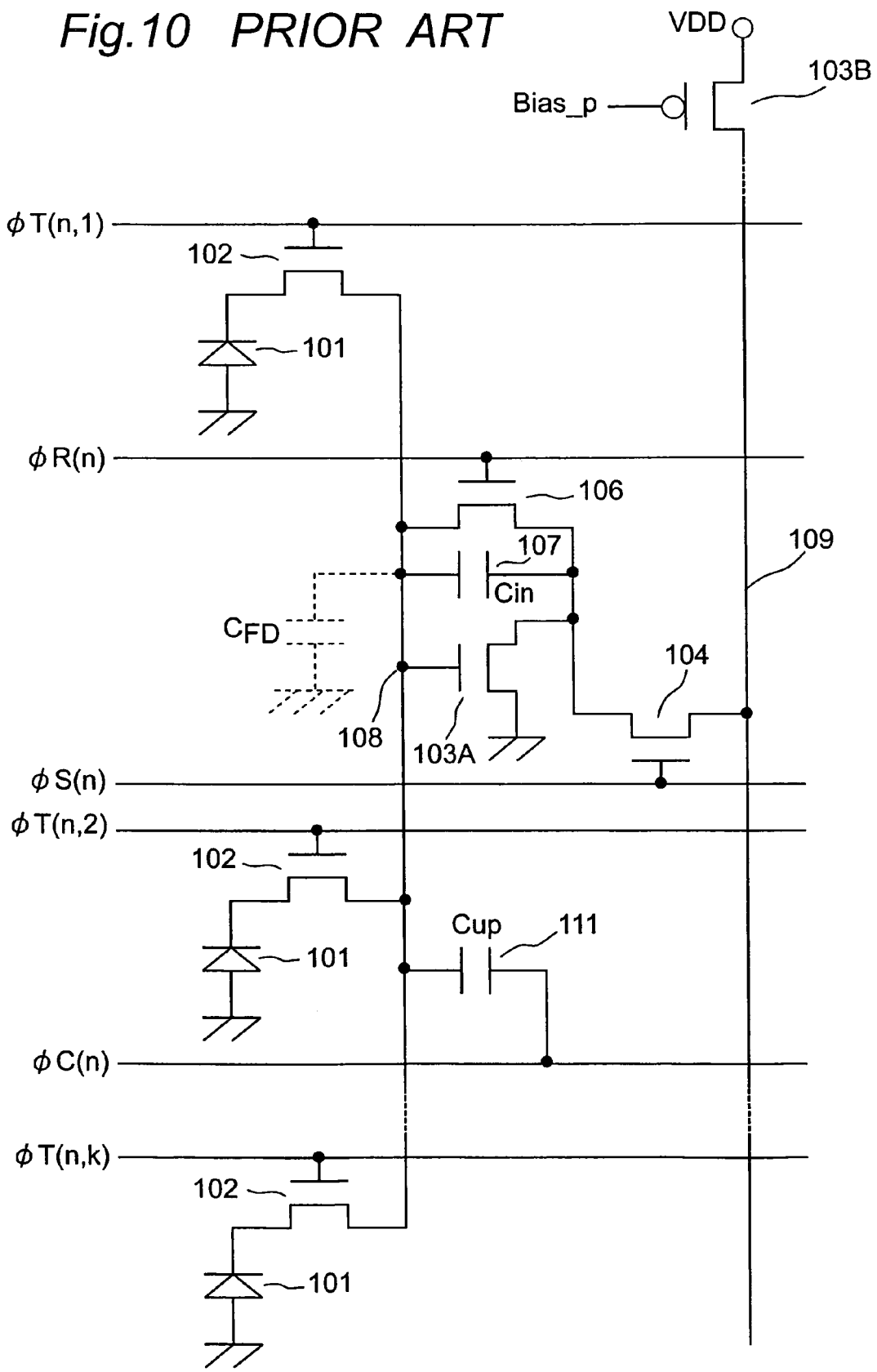
FIG. 10 is a view showing a construction of a conventional two-dimensional amplification type solid-state image pickup device.
Figure 11:
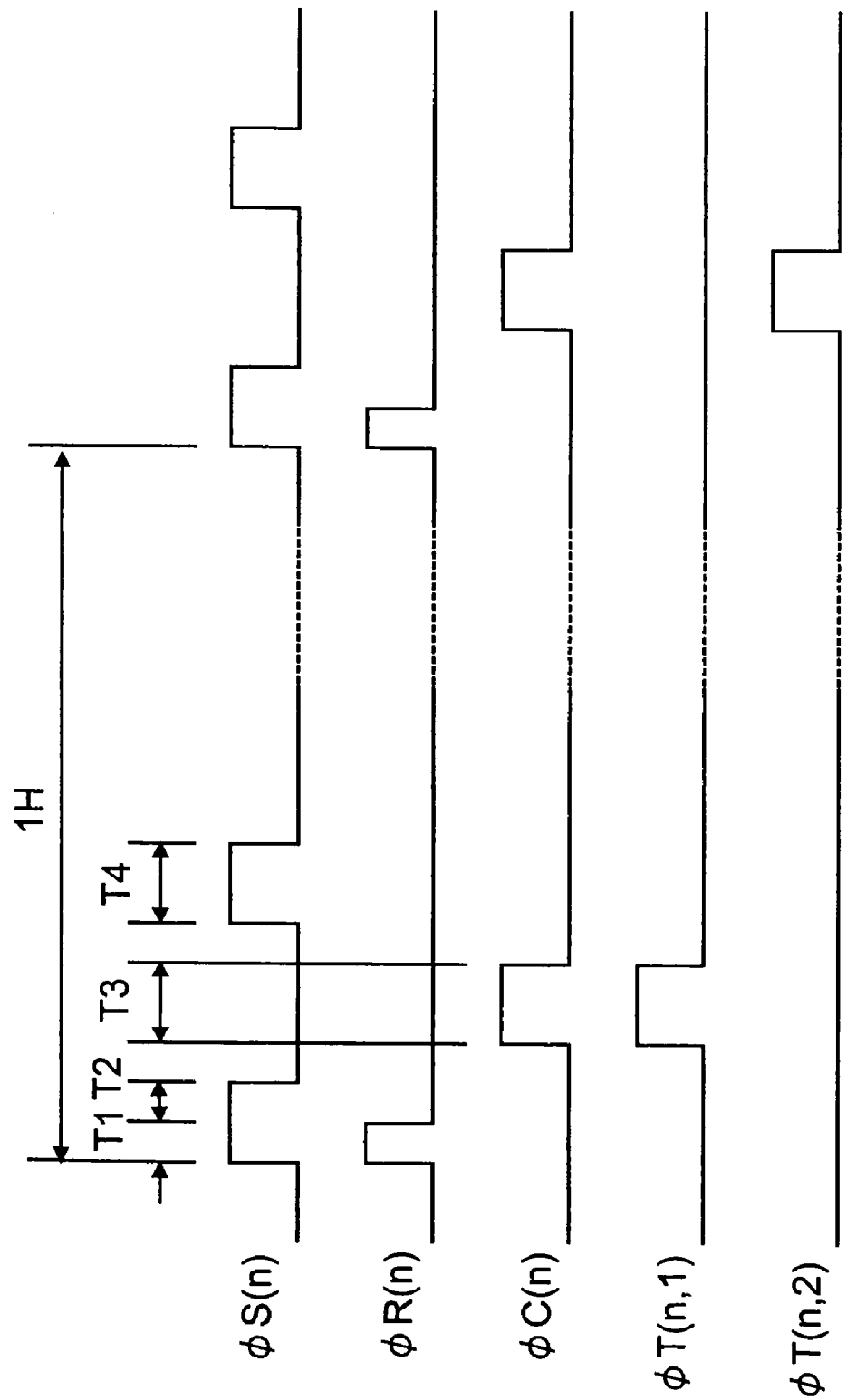
FIG. 11 is a chart showing operation timings of the above two-dimensional amplification type solid-state image pickup device.
Figure 12:
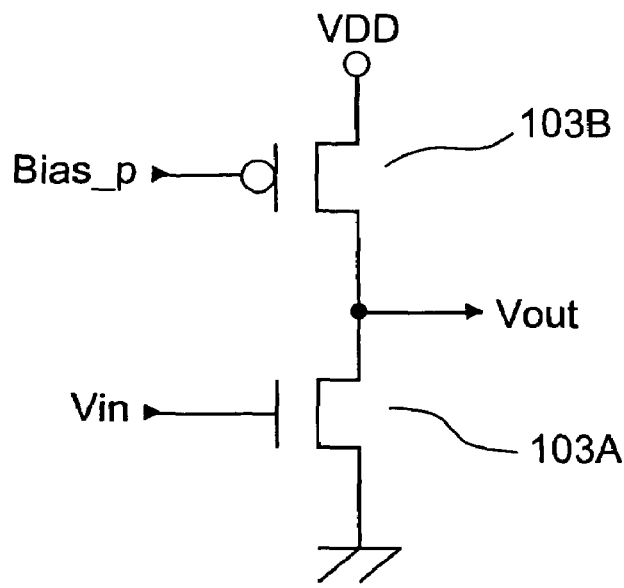
FIG. 12 is a view showing a circuit construction of a constant-current load source-grounded inverting amplifier made up of elements of the above two-dimensional amplification type solid-state image pickup device.
Figure 13:
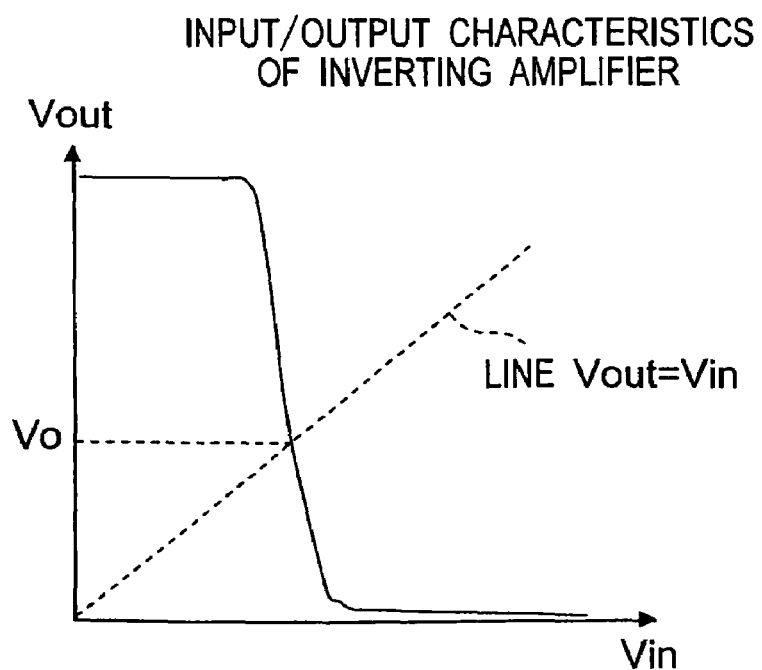
FIG. 13 is a chart showing characteristics of the inverting amplifier shown in FIG. 12.

FIG. 9 shows drive timings in a case where the n-th line is a non-selected line. In this case, the gate drive signal lines T(n,1), T(n,2), . . . , T(n,m) for controlling the transfer transistors 2, the gate drive signal line R(n) for controlling the reset transistors 6 and the boost signal line C(n) are at low level because of the non-selection.

Also, in the periods T1 to T4, the control signal φV(n) applied to the power supply line of the inverting amplifier (3A, 3B) via the control line V(n) goes low level, and therefore the output of the inverting amplifier (3A, 3B) (i.e. input of the current amplification transistor 5A of the current amplification section 21A) goes ground level through the constant-current load transistor 3B.

As a result, the current amplification transistor 5A turns off, so that a non-selection operation for the n-th line can be achieved even if such a select transistor as in the first embodiment is not included. This deletion of the select transistor allows the number of transistors per pixel can be further cut down, compared with the first embodiment. Then, the area occupied by the photodiodes 1 can be increased accordingly, which in turn allows higher sensitivity to be realized.

Also, controlling the voltage of the power supply line of the inverting amplifier (3A, 3B) by the control section of the vertical scanning circuit 25 makes it possible to halt the operation when a relevant photoelectric conversion section 10 is a non-selected line. This eliminates the need for the select transistor, which would be involved in the prior art, so that the number of transistors per pixel can be reduced.

Also, by an operation that the voltage of the power supply line of the inverting amplifier (3A, 3B) of the switched capacitor amplifier section 20B is set low level by the control section of the vertical scanning circuit 25, the output of the inverting amplifier (3A, 3B) can be set low level, by which the operation of the current amplification section 21A can be halted.

The foregoing first to third embodiments have been described on a two-dimensional amplification type solid-state image pickup device in which pixels are two-dimensionally arrayed, as an example of the amplification type solid-state image pickup device. However, the invention may be applied to amplification type solid-state image pickup devices in which pixels are one-dimensionally arrayed.

Although the invention has been fully described on its specific embodiments hereinabove, various changes and modifications may be made without departing from the scope of the invention without being limited to the foregoing first to third embodiments. Such variations are not to be regarded as a departure from the spirit and scope of the invention, and all such modifications as would be obvious to one skilled in the art are intended to be included within the scope of the following claims.

The invention claimed is:

1. An amplification type solid-state image pickup device including: a plurality of photoelectric conversion sections each having a photoelectric conversion element; and a transfer transistor for transferring signal charge of the photoelectric conversion element, in which signals from the plurality of photoelectric conversion sections are amplified and outputted, respectively, to a common signal line, further including:

a switched capacitor amplifier section whose input side is connected to a charge detection node to which output terminals of the plurality of photoelectric conversion sections are connected in common, the switched capacitor amplifier section serving for converting the signal charge from each of the plurality of photoelectric conversion sections into voltage; and a current amplification section for current-amplifying and outputting the signal, which has been converted into voltage by the switched capacitor amplifier section, to the common signal line.

2. The amplification type solid-state image pickup device as claimed in claim 1, wherein the switched capacitor amplifier section has:

an inverting amplifier whose input terminal is connected to the charge detection node;

a reset transistor connected between the charge detection node and an output terminal of the inverting amplifier; and a first capacitance element connected between the charge detection node and the output terminal of the inverting amplifier.

3. The amplification type solid-state image pickup device as claimed in claim 2, wherein the inverting amplifier of the switched capacitor amplifier section is a constant-current load source-grounded inverting amplifier.

4. The amplification type solid-state image pickup device as claimed in claim 3, wherein a constant-current load of the constant-current load source-grounded inverting amplifier is a depletion-type transistor.

5. The amplification type solid-state image pickup device as claimed in claim 1, wherein the current amplification section has a current-amplifying MOS transistor to gate of which an output terminal of the switched capacitor amplifier section is connected, a common load section is connected to the current-amplifying MOS transistor via the common signal line, and the current-amplifying MOS transistor and the common signal line constitute an amplifier.

6. The amplification type solid-state image pickup device as claimed in claim 5, wherein
the current amplification section has a select transistor connected between the current-amplifying MOS transistor and the common signal line.

7. The amplification type solid-state image pickup device as claimed in claim 5, wherein
a drain-grounded type source follower circuit is formed by a combination of the current-amplifying MOS transistor and the common load section.

8. The amplification type solid-state image pickup device as claimed in claim 1, wherein
the photoelectric conversion element is an embedded-type photodiode.

9. The amplification type solid-state image pickup device as claimed in claim 1, further comprising:
a second capacitance element whose one end is connected to the charge detection node; and
a boost section which is connected to the other end of the second capacitance element and which is for deepening a potential of the charge detection node by capacitive coupling via the second capacitance element.

10. The amplification type solid-state image pickup device as claimed in claim 1, wherein
the switched capacitor amplifier section is a select-type switched capacitor amplifier section for outputting the signal, which has been converted into voltage, via the select transistor,
the select-type switched capacitor amplifier section is provided in plurality, and
a node to which output terminals of the plurality of select-type switched capacitor amplifier sections are connected in common is connected to an input side of the current amplification section.

11. The amplification type solid-state image pickup device as claimed in claim 3, further comprising:
a control section for controlling voltage of a power supply line of the inverting amplifier of the switched capacitor amplifier section.

12. The amplification type solid-state image pickup device as claimed in claim 11, wherein
operation of the current amplification section is halted by setting an output of the inverting amplifier to low level, which is effected by the control section's setting a voltage of the power supply line of the inverting amplifier of the switched capacitor amplifier section to low level out of high and low levels.

* * * * *